(12) United States Patent
Zhang

(10) Patent No.: US 10,910,385 B2
(45) Date of Patent: Feb. 2, 2021

(54) VERTICAL GATE-ALL-AROUND TFET

(71) Applicant: STMICROELECTRONICS, INC., Coppell, TX (US)

(72) Inventor: John H. Zhang, Altamont, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 16/510,612

(22) Filed: Jul. 12, 2019

(65) Prior Publication Data

US 2020/0006350 A1    Jan. 2, 2020

Related U.S. Application Data

(60) Continuation of application No. 15/939,108, filed on Mar. 28, 2018, now Pat. No. 10,388,659, which is a
(Continued)

(51) Int. Cl.
*H01L 27/108*    (2006.01)
*H01L 29/06*    (2006.01)
(Continued)

(52) U.S. Cl.
CPC ........ *H01L 27/10879* (2013.01); *B82Y 10/00* (2013.01); *H01L 21/28008* (2013.01); *H01L 21/823814* (2013.01); *H01L 21/823871* (2013.01); *H01L 21/823885* (2013.01); *H01L 21/823892* (2013.01); *H01L 27/0814* (2013.01); *H01L 27/092* (2013.01); *H01L 27/0928* (2013.01); *H01L 29/0653* (2013.01); *H01L 29/0676* (2013.01); *H01L 29/1033* (2013.01); *H01L 29/16* (2013.01); *H01L 29/20* (2013.01); *H01L 29/42392* (2013.01);
(Continued)

(58) Field of Classification Search
CPC ......... H01L 29/42392; H01L 29/66795; H01L 29/66909; H01L 29/78642; H01L 29/7827; H01L 29/4236; H01L 29/66666; H01L 27/10879; H01L 27/0886; H01L 27/0924; H01L 2029/7858
See application file for complete search history.

(56) References Cited

U.S. PATENT DOCUMENTS 8,217,435 B2    7/2012 Chang et al.
8,759,874 B1    6/2014 Loubet et al.
(Continued)

*Primary Examiner* — Hsien Ming Lee
(74) *Attorney, Agent, or Firm* — Seed IP Law Group LLP

(57) ABSTRACT

A vertical tunneling FET (TFET) provides low-power, high-speed switching performance for transistors having critical dimensions below 7 nm. The vertical TFET uses a gate-all-around (GAA) device architecture having a cylindrical structure that extends above the surface of a doped well formed in a silicon substrate. The cylindrical structure includes a lower drain region, a channel, and an upper source region, which are grown epitaxially from the doped well. The channel is made of intrinsic silicon, while the source and drain regions are doped in-situ. An annular gate surrounds the channel, capacitively controlling current flow through the channel from all sides. The source is electrically accessible via a front side contact, while the drain is accessed via a backside contact that provides low contact resistance and also serves as a heat sink. Reliability of vertical TFET integrated circuits is enhanced by coupling the vertical TFETs to electrostatic discharge (ESD) diodes.

20 Claims, 13 Drawing Sheets

Related U.S. Application Data continuation of application No. 15/482,610, filed on Apr. 7, 2017, now Pat. No. 9,953,983, which is a continuation of application No. 15/177,231, filed on Jun. 8, 2016, now Pat. No. 9,653,585, which is a division of application No. 14/675,536, filed on Mar. 31, 2015, now Pat. No. 9,385,195.

(51) Int. Cl.

| | | |
|---|---|---|
| *H01L 29/16* | (2006.01) | |
| *H01L 29/78* | (2006.01) | |
| *H01L 29/20* | (2006.01) | |
| *H01L 29/66* | (2006.01) | |
| *H01L 21/28* | (2006.01) | |
| *H01L 29/10* | (2006.01) | |
| *B82Y 10/00* | (2011.01) | |
| *H01L 29/775* | (2006.01) | |
| *H01L 27/08* | (2006.01) | |
| *H01L 27/092* | (2006.01) | |
| *H01L 29/739* | (2006.01) | |
| *H01L 21/8238* | (2006.01) | |
| *H01L 29/423* | (2006.01) | |
| *H01L 29/786* | (2006.01) | |
| *H01L 31/0392* | (2006.01) | |
| *H01L 33/04* | (2010.01) | |
| *H01L 45/00* | (2006.01) | |
| *H01L 29/49* | (2006.01) | |

(52) U.S. Cl.
CPC .. *H01L 29/66439* (2013.01); *H01L 29/66666* (2013.01); *H01L 29/66795* (2013.01); *H01L 29/66909* (2013.01); *H01L 29/66977* (2013.01); *H01L 29/7391* (2013.01); *H01L 29/775* (2013.01); *H01L 29/7827* (2013.01); *H01L 29/7855* (2013.01); *H01L 29/7856* (2013.01); *H01L 29/78618* (2013.01); *H01L 29/78642* (2013.01); *H01L 29/78696* (2013.01); *H01L 31/0392* (2013.01); *H01L 33/04* (2013.01); *H01L 45/1233* (2013.01); *H01L 21/823807* (2013.01); *H01L 21/823828* (2013.01); *H01L 21/823878* (2013.01); *H01L 29/495* (2013.01); *H01L 29/4966* (2013.01); *H01L 2029/7858* (2013.01)

(56) References Cited

U.S. PATENT DOCUMENTS

| | | |
|---|---|---|
| 9,337,263 B2 | 5/2016 | Wu et al. |
| 2002/0011633 A1 | 1/2002 | Kumagai |
| 2009/0045481 A1 | 2/2009 | Niimura et al. |
| 2013/0112945 A1 | 5/2013 | Gilet et al. |
| 2013/0175617 A1 | 7/2013 | Liu et al. |
| 2013/0341596 A1 | 12/2013 | Chang et al. |
| 2014/0175554 A1 | 6/2014 | Loubet et al. |
| 2014/0353593 A1 | 12/2014 | Smets |
| 2015/0357432 A1 | 12/2015 | Lin et al. |
| 2015/0372104 A1 | 12/2015 | Liu et al. |
| 2016/0093608 A1 | 3/2016 | Chu et al. |

VERTICAL GATE-ALL-AROUND TFET

BACKGROUND

Technical Field

The present disclosure generally relates to various geometries for gate-all-around transistor devices built on a silicon substrate and, in particular, to transistors that are suitable for low-power applications.

Description of the Related Art

Conventional integrated circuits incorporate planar field effect transistors (FETs) in which current flows through a semiconducting channel between a source and a drain, in response to a voltage applied to a control gate. The semiconductor industry strives to obey Moore's law, which holds that each successive generation of integrated circuit devices shrinks to half its size and operates twice as fast. As device dimensions have shrunk below 100 nm, however, conventional silicon device geometries and materials have experienced difficulty maintaining switching speeds without incurring failures such as, for example, leaking current from the device into the semiconductor substrate. Several new technologies have emerged that allowed chip designers to continue shrinking gate lengths to 45 nm, 22 nm, and then as low as 14 nm. One particularly radical technology change entailed re-designing the structure of the FET from a planar device to a three-dimensional device in which the semiconducting channel was replaced by a fin that extends out from the plane of the substrate. In such a device, commonly referred to as a FinFET, the control gate wraps around three sides of the fin so as to influence current flow from three surfaces instead of one. The improved control achieved with a 3-D design results in faster switching performance and reduced current leakage. Building taller devices has also permitted increasing the device density within the same footprint that had previously been occupied by a planar FET. Examples of FinFET devices are described in further detail in U.S. Pat. No. 8,759,874 and U.S. Patent Publication 2014/0175554, assigned to the same assignee as the present patent application.

The FinFET concept was further extended by developing a gate-all-around FET, or GAA FET, in which the gate fully wraps around the channel for maximum control of the current flow therein. In the GAA FET, the channel can take the form of a cylindrical nanowire that is isolated from the substrate, in contrast to the peninsular fin. In the GAA FET the cylindrical nanowire is surrounded by the gate oxide, and then by the gate. Existing GAA FETs are oriented horizontally, such that the nanowire extends in a direction that is substantially parallel to the surface of the semiconductor substrate. GAA FETs are described in, for example, U.S. Patent Publication No. 2013/0341596 to Chang et al., of IBM, and in U.S. Patent Publication No. 2015/0372104 to Liu et al., assigned to the same assignee as the present patent application.

As integrated circuits shrink with each technology generation, more power is needed to drive a larger number of transistors housed in a smaller volume. To prevent chips from overheating, and to conserve battery power, each generation of transistors is designed to operate at a lower voltage and to dissipate less power. In a conventional complementary metal-oxide-semiconductor (CMOS) field effect transistor, the source and drain are doped to have a same polarity, e.g., both positive, in a P-FET, or both negative, in an N-FET. When the gate voltage applied to the transistor, $V_G$, exceeds a threshold voltage, $V_T$, the device turns on and current flows through the channel. When the gate voltage applied to the transistor is below the threshold voltage, the drain current, $I_D$, ideally is zero and the device is off. However, in reality, in the sub-threshold regime, there exists a small leakage current that is highly sensitive to the applied voltage. Over time, the leakage current drains charge from the power supply, e.g., a mobile phone battery or a computer battery, thus necessitating more frequent recharging. A change in gate voltage that is needed to reduce the sub-threshold leakage current by a factor of 10 is called the sub-threshold swing. It is desirable for the sub-threshold swing to be as small as possible. It is understood by those skilled in the art that MOSFETs have reached their lower limit of sub-threshold swing at 60 mV/decade. Thus, a different type of device is needed to further decrease the sub-threshold swing.

Tunneling field effect transistors (TFETs) are considered promising alternatives to conventional CMOS devices for use in future integrated circuits having low-voltage, low-power applications. Unlike a MOSFET, the source and drain of a TFET are doped to have opposite polarity. During operation of the TFET, charge carriers tunnel through a potential barrier rather than being energized to surmount the potential barrier, as occurs in a MOSFET. Because switching via tunneling requires less energy, TFETs are particularly useful in low-power applications such as mobile devices, for which battery lifetime is of utmost importance. Another reason TFETs provide enhanced switching performance for low-voltage operation is that TFETs have substantially smaller values of sub-threshold swing than MOSFETs.

BRIEF SUMMARY

A vertical TFET provides low-power, high-speed switching performance for transistors having critical dimensions below 7 nm. In one embodiment, the vertical TFET is implemented in silicon, using a gate-all-around (GAA) device architecture. The vertical GAA TFET is a linear, or 1-D, device in the form of a nanowire oriented transverse to planar front and back surfaces of the silicon substrate. The nanowire includes a lower drain region, a channel, and an upper source region, which are grown epitaxially from the doped well. The channel region is made of intrinsic silicon, while the source and drain regions are doped in-situ. An annular gate surrounds the channel region, capacitively controlling current flow through the channel from all sides. The source is electrically accessible via a front side contact, while the drain is accessed via a backside contact that provides low contact resistance and also serves as a heat sink.

Reliability of vertical TFET integrated circuits is enhanced by coupling the TFETs to electrostatic discharge (ESD) diodes. Both vertical and horizontal ESD diode configurations are described herein. ESD diodes provide protection for TFETs and other GAA transistors against high currents and voltages, especially in analog and I/O applications.

Fabrication of the vertical TFETs and ESD diodes as described herein is compatible with conventional CMOS manufacturing processes. Low-power operation allows the vertical TFET to provide a high current density, or "current per footprint" on a chip, compared with conventional planar transistors. The high current density allowed by these devices makes them good candidates for memory applications, e.g., for SRAM arrays.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

DETAILED DESCRIPTION

Figure 1:
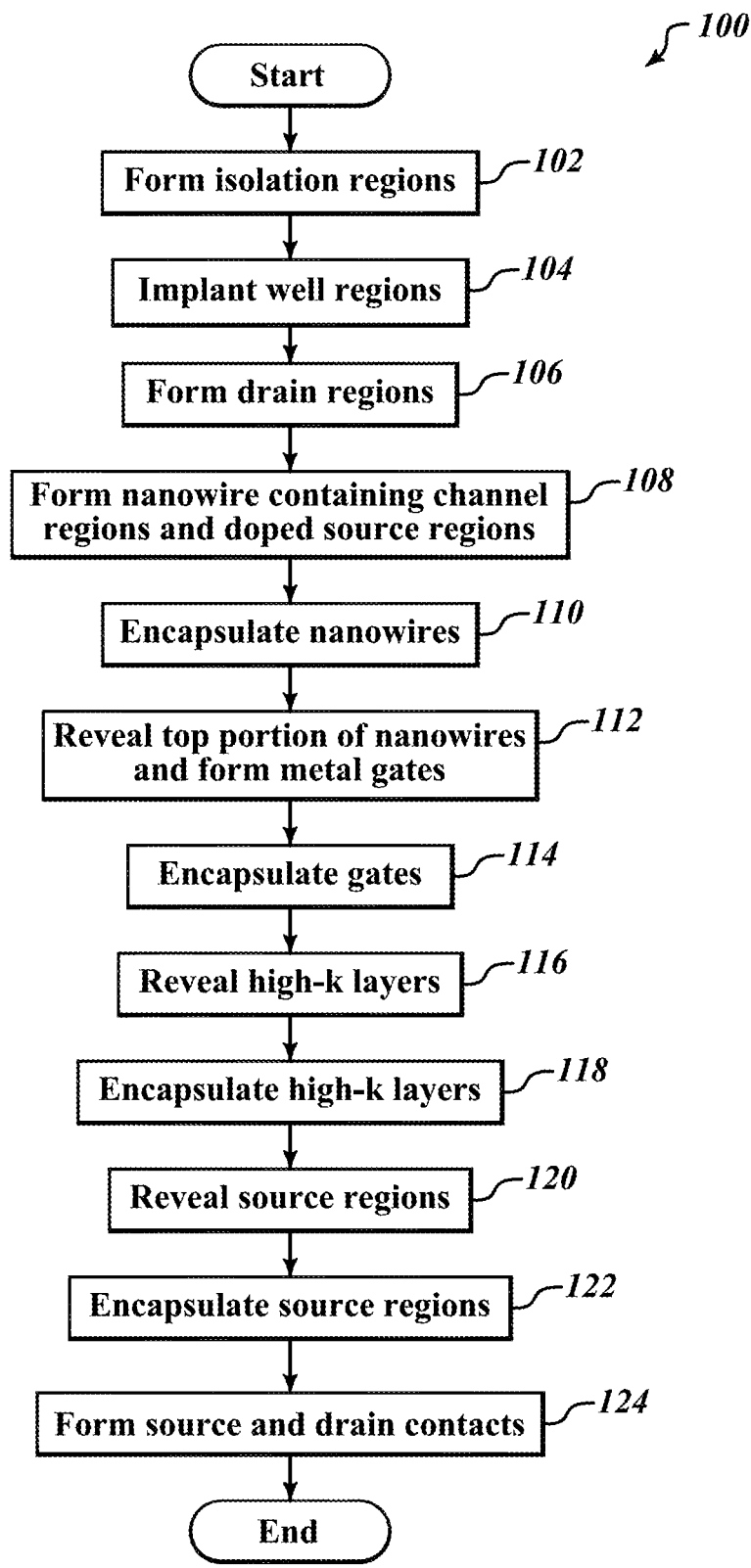
FIG. 1 is a flow diagram showing steps in a method of fabricating a pair of n-type and p-type vertical GAA TFETs as illustrated in FIGS. 2-12, according to one embodiment described herein.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers. Throughout the specification, the terms "N-well" and "N-well region" are used synonymously in reference to negatively-doped regions of a semiconductor. Likewise, the terms "P-well" and "P-well region" are also used synonymously in reference to positively-doped regions of a semiconductor.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to vertical gate-all-around TFET devices that have been produced; however, the present disclosure and the reference to certain materials, dimensions, and the details and ordering of processing steps are exemplary and should not be limited to those shown.

Figure 12:
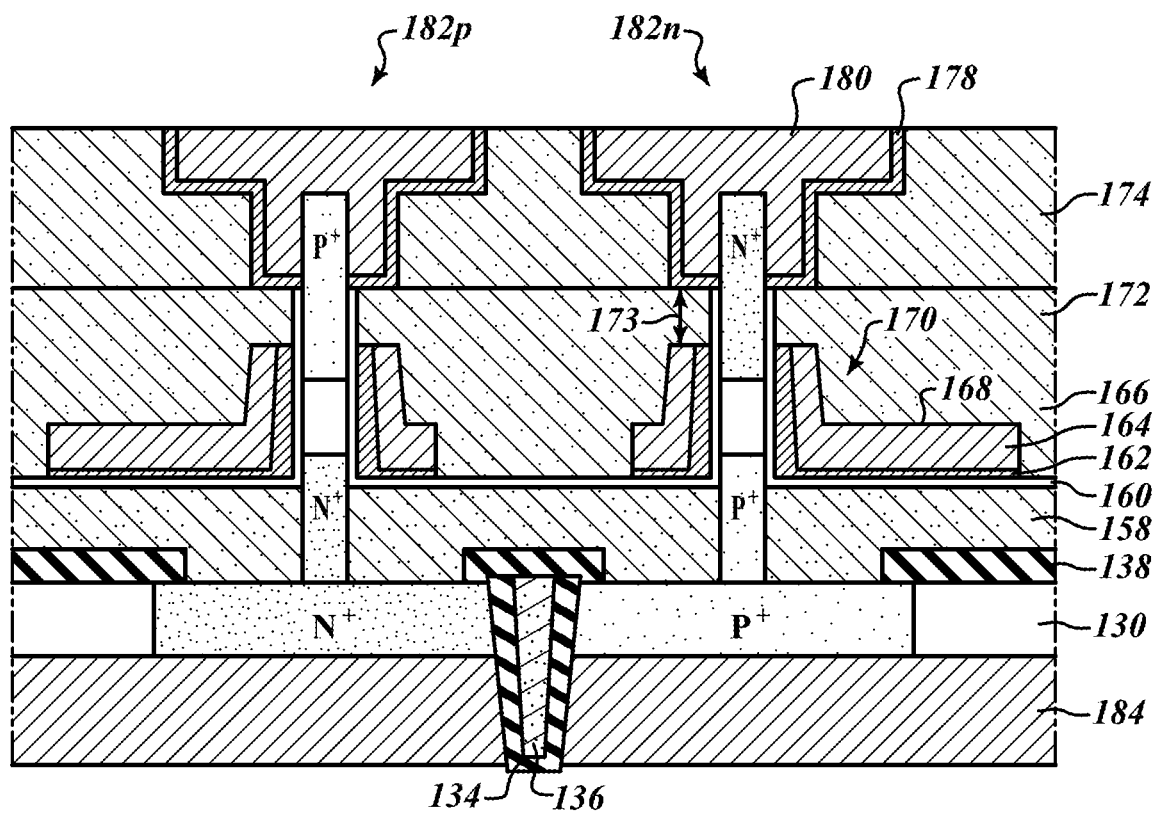

Turning now to the figures, FIG. 1 shows steps in a method 100 of fabricating a pair of vertical GAA TFETs 182$n$,$p$, according to one embodiment. The completed GAA TFET devices produced by the method 100 are shown in FIG. 12. Alternative embodiments of the GAA TFET, formed by modifying the method 100, are shown in FIGS.

13-14. Each vertical GAA TFET is in the form of an epitaxially grown pillar having a doped lower drain region, a central channel region made of intrinsic silicon, and an upper source region doped to have a polarity opposite that of the lower drain region. The central channel region extends between the source and drain regions. A gate structure surrounds the channel region so as to influence current flow between the source and drain regions in response to an applied voltage. Steps in the method 100 are further illustrated by FIGS. 2-12, and described below.

Figure 2:
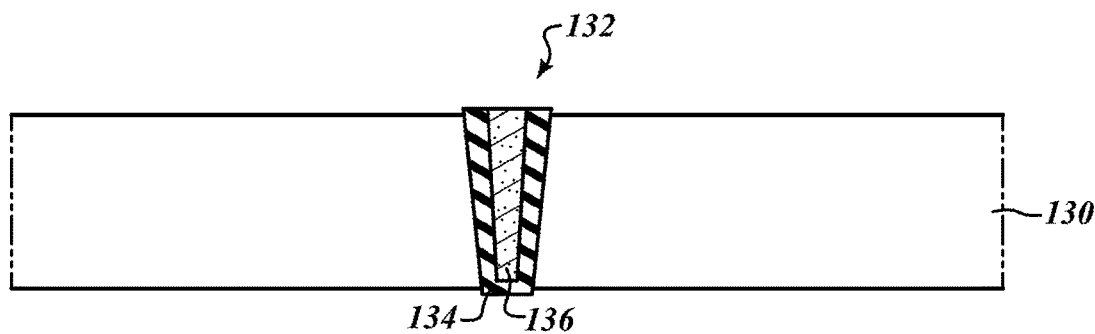
FIGS. 2-12 are cross-sectional views of the vertical GAA TFETs at successive steps during fabrication using the method shown in FIG. 1.

At 102, an isolation region 132 is formed in a silicon substrate 130 to separate p-type and n-type devices that will subsequently be formed. The isolation region 132 includes a liner 134 made of, for example, silicon nitride, and a silicon dioxide core 136, as shown in FIG. 2.

Figure 3:
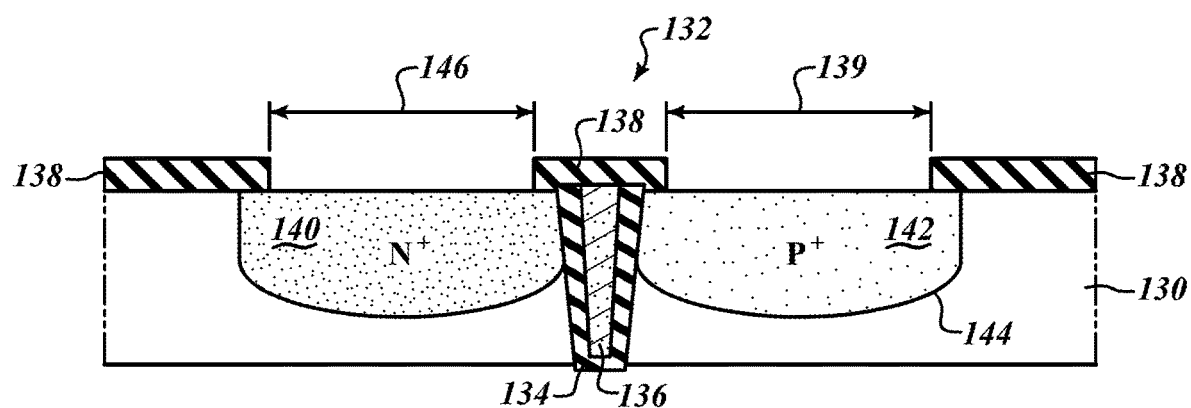

At 104, with reference to FIG. 3, a silicon substrate 130 having a <111> crystal orientation is doped to form an N-well 140 and a P-well 142 by ion implantation using a hard mask 138, as is well known in the art. The exemplary hard mask 138 is made of silicon dioxide ($SiO_2$) having a thickness in the range of about 10 nm-50 nm. The hard mask 138 is grown or deposited over the surface of the silicon substrate 130, and is patterned with a first opening 139 to define the P-well 142, for example. Positive dopants such as boron ions are implanted into the silicon substrate 130 through the first opening 139 and then annealed to drive in the dopants to a selected depth 144. In one embodiment, the boron concentration is desirably within the range of about 1.0 E16 $cm^{-3}$-5.0 E20 $cm^{-3}$, targeted at 5.0 E19 $cm^{-3}$. Then the hard mask 138 is stripped, re-formed, and patterned with a second opening 146 for the N-well 140. Negative dopants such as phosphorous ions or arsenic ions are then implanted into the silicon substrate 130 through the second opening 146, followed by annealing to drive in the negative dopants to the selected depth 144. In one embodiment, the n-dopant concentration is desirably within the range of about 1.0 E16 $cm^{-3}$-3.0 E20 $cm^{-3}$, targeted at 2.0 E19 $cm^{-3}$. The first and second openings 139 and 146, respectively, can be the same size or different sizes, within a wide range of about 2 nm-200 nm.

Figure 4:
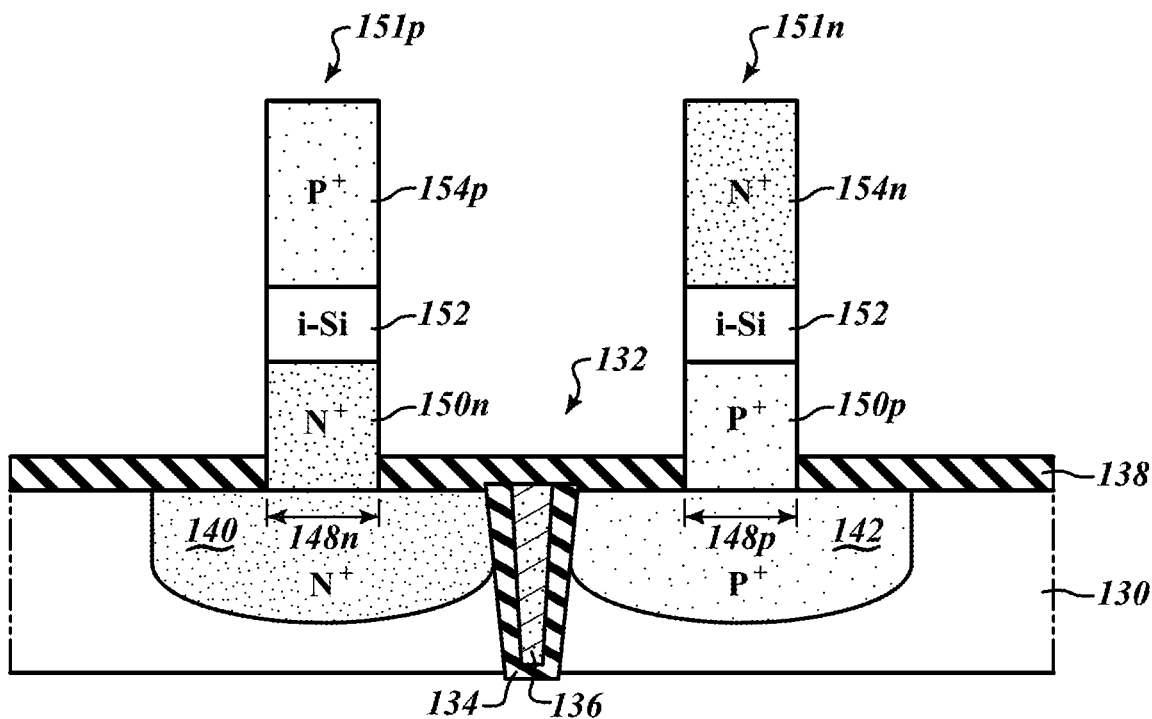

At 106, epitaxial drain regions 150n and 150p are formed by epitaxial growth from the N-well and P-well regions 140 and 142 as shown in FIG. 4, extending in a transverse orientation to the silicon substrate 130. The hard mask 138 is stripped, re-formed, and re-patterned with a smaller opening 148n, for example. The drain region 150n is then grown epitaxially from a top surface of the N-well 140. The hard mask 138 is again stripped, re-formed, and re-patterned with a small opening 148p. The drain region 150p is then grown epitaxially from a top surface of the P-well 142. The drain regions 150n and 150p are grown to a height anywhere within the wide range of about 5 nm-500 nm, with doping occurring in-situ during the epitaxial growth. The order in which the n- and p-type structures are patterned and grown is exemplary as described above, and can be reversed.

Figure 5:
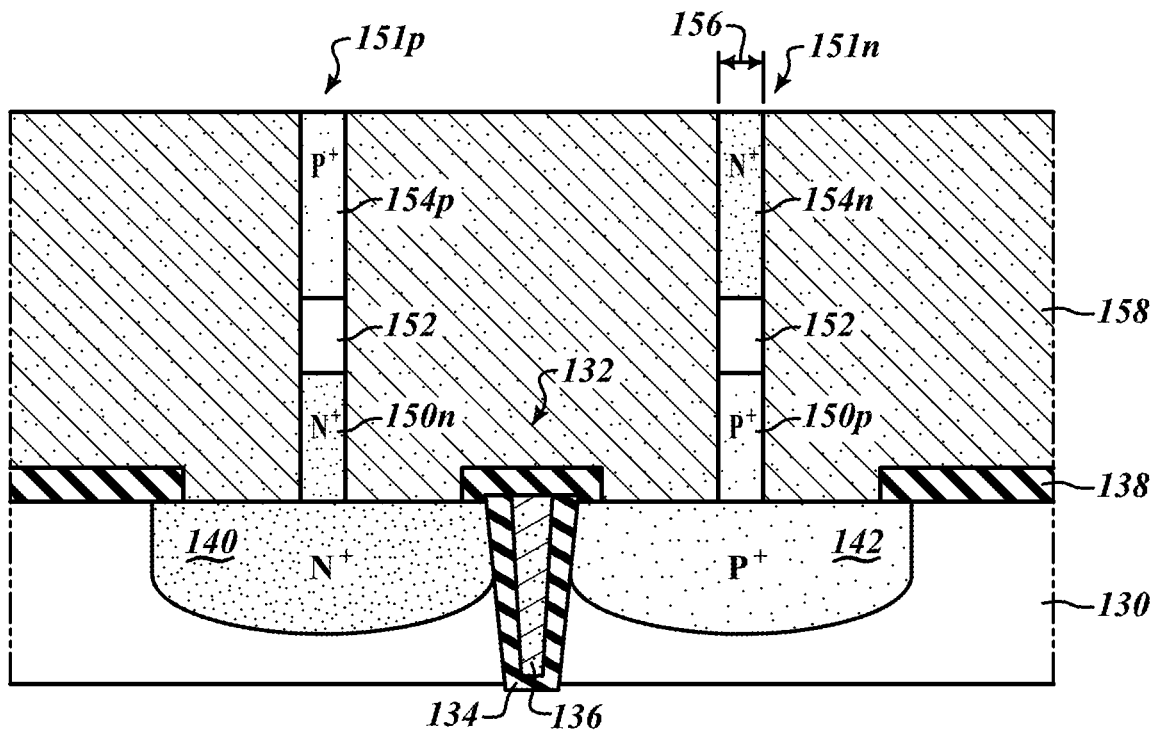

At 108, nanowires 151n and 151p containing intrinsic silicon channels 152 and source regions 154n and 154p, respectively, are grown epitaxially from the drain regions 150n and 150p to complete formation of the pillars. First, cylindrical channels 152 made of intrinsic silicon are grown to a height within the range of 2 nm-100 nm. Then, a source region 154n made of indium arsenide (InAs), an n-type material, is selectively grown from the intrinsic silicon channel 152 that overlies the P-well 142 while a source region 154p made of a boron-SiGe compound ($BSi_xGe_{(1-x)}$), a p-type material, is selectively grown from the intrinsic silicon channel 152 that overlies the N-well 140, as shown in FIG. 4. The source regions 154n and 154p are each grown to a thickness within the range of about 5 nm-500 nm. The epitaxial nanowires 151n and 151p, as grown, have widths 148p and 148n, respectively. Next, the epitaxial nanowires 151n and 151p are trimmed to a target critical dimension (CD) 156, as needed, as shown in FIG. 5 using a plasma etching process. The CD 156 can be defined using a silicon nitride hard mask, for example. In one embodiment, epitaxial growth of the regions 150n, 150p, 152, 154p, and 154n may occur inside patterned pillar-shaped holes formed in an insulating material, to provide support for the vertical nanowires 151n and 151p. The insulating material can include one or more layers, and the pillar-shaped holes may further include liners. The pillar-shaped holes may be used to define CD boundaries for the vertical nanowires 151n and 151p.

At 110, the epitaxial nanowires 151n and 151p are encapsulated by spin-coating a thick layer of benzocyclobutene (BCB) 158 to cover the epitaxial nanowires, and then performing a chemical-mechanical planarization (CMP) operation that stops on the InAs and $BSi_xGe_{(1-x)}$ source regions 154n and 154p, respectively.

Figure 6:
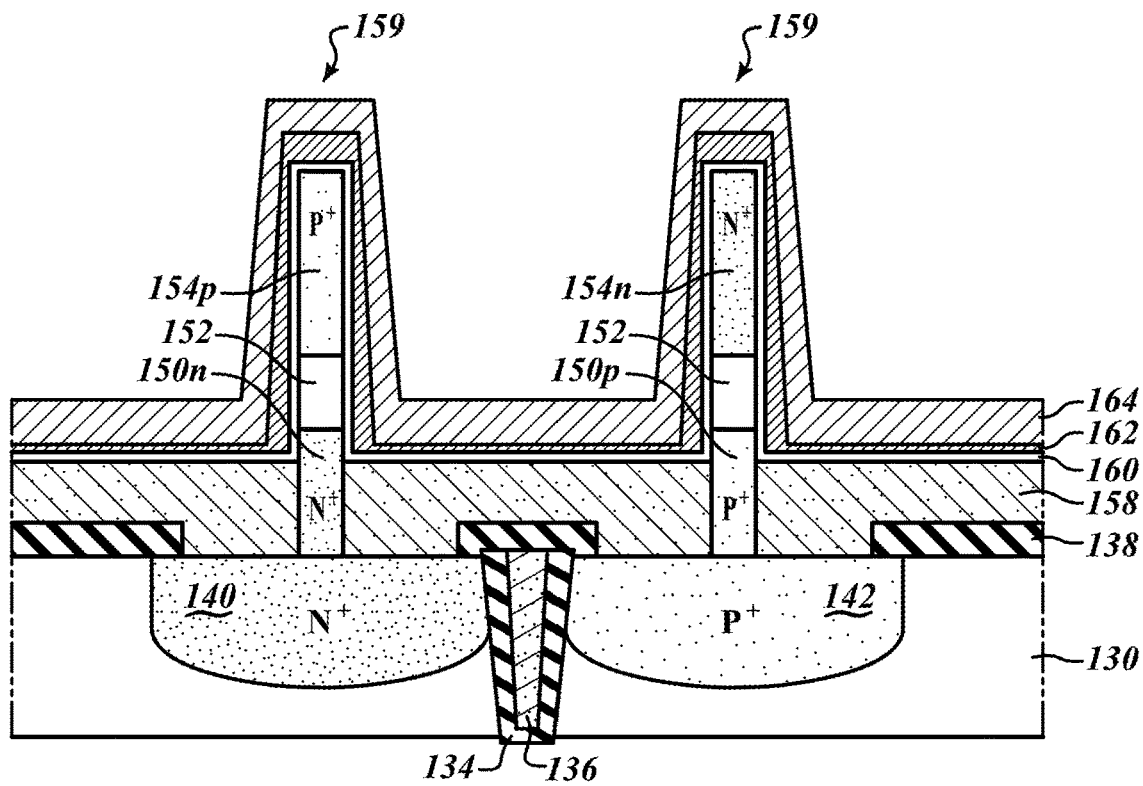
Figure 7:
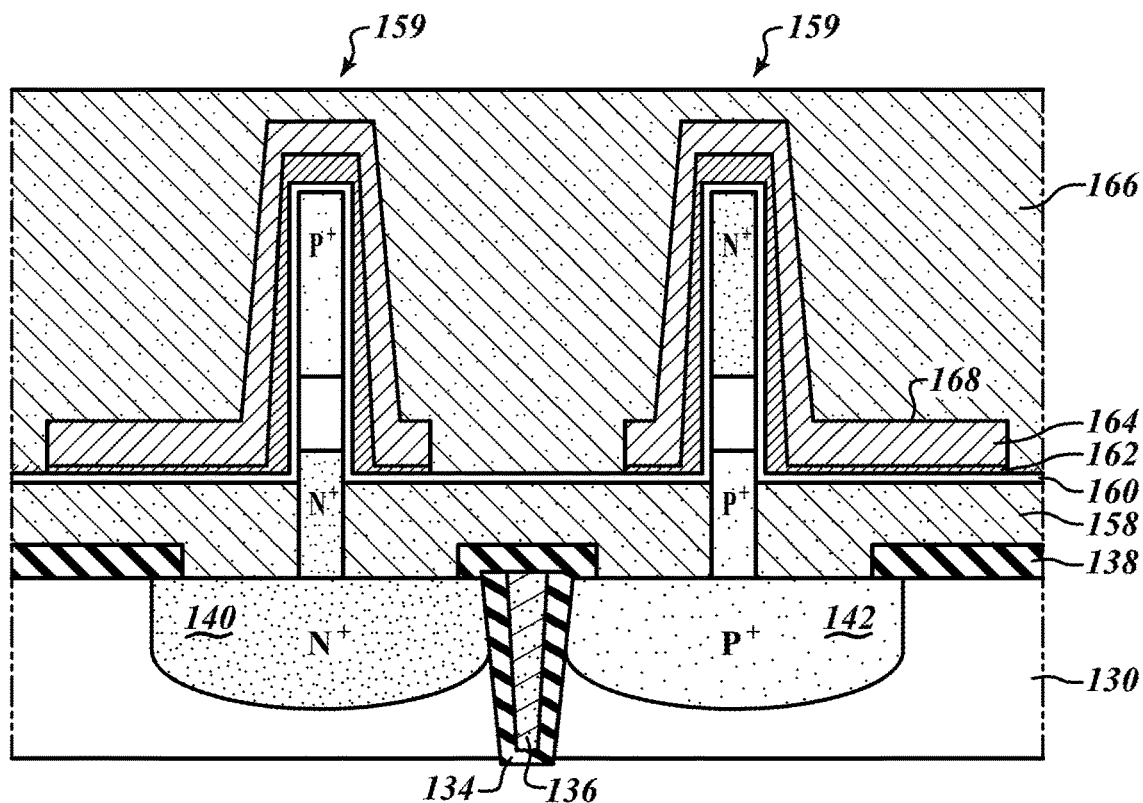
Figure 8:
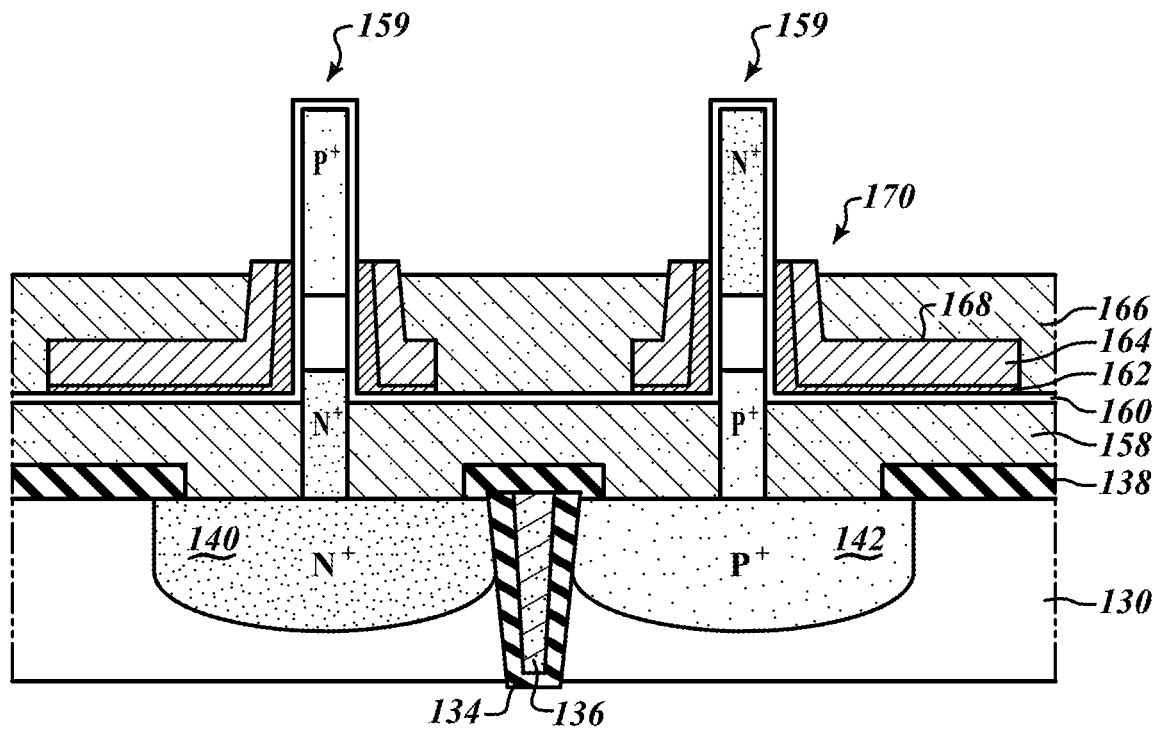
Figure 9:
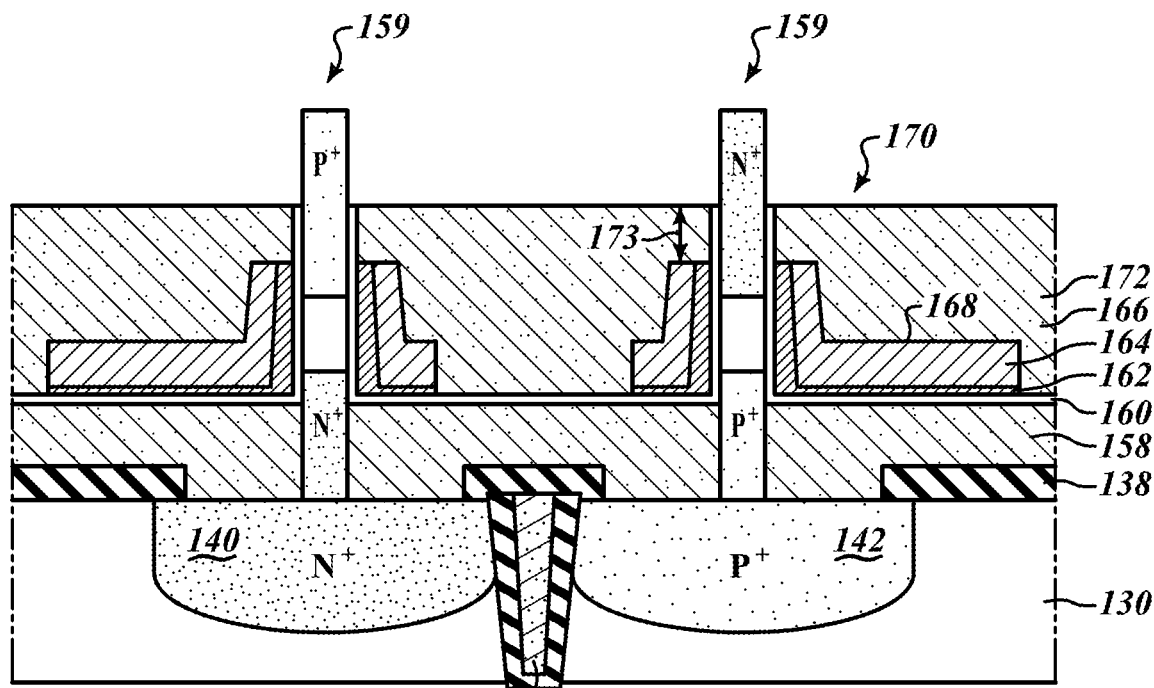

At 112, the BCB encapsulant 158 is etched back to reveal the epitaxial nanowires 151n and 151p and top portions of the drain regions 150n and 150p, so that multi-layer gate structures 159 can be formed in contact with the exposed nanowires, as shown in FIG. 6, according to one embodiment. The multi-layer gate structures 159 include a dielectric sheath wrapped around the channel and a metal gate wrapped around the dielectric sheath. The etch-back process can be, for example, a plasma etch process that uses an $O_2$—$SF_6$ chemistry. Once the epitaxial nanowires are exposed, a gate oxide 160 is conformally deposited. The gate oxide 160 is desirably a high dielectric constant, or high-k, material of thickness 1 nm-10 nm, such as $HfO_2$ or $Al_2O_3$, for example. Next, a work function material 162 of thickness 1 nm-20 nm is conformally deposited, followed by a gate metal 164 of thickness 10 nm-200 nm. The gate metal 164 and the work function material 162 can be, for example, copper (Cu), aluminum (Al), tungsten (W), platinum (Pt), gold (Au), titanium nitride (TiN), tantalum nitride (TaN), titanium carbon (TiC), titanium-tungsten ($TiW_x$), or combinations thereof. Regions of the gate stack located between adjacent nanowires are then etched away as shown in FIG. 7, while regions of the gate stack outside the epitaxial nanowires remain to form gate contact landing pads 168.

At 114, the gate structures 159 are encapsulated. In one embodiment, encapsulation is accomplished by spin coating a second BCB layer 166, followed by a CMP process that is targeted to stop when a selected BCB thickness has been reached, above the metal gate structures 159. Alternatively, the planarization process can stop on the metal gate structures 159.

At 116, the second BCB layer 166 is etched back to reveal portions of the metal gate structures 159 covering the source regions 154n, 154p to a level in the range of about 1 nm-300 nm above the intrinsic silicon channel 152 to expose the gate metal 164. Then, the gate metal 164 and the work function material 162 are etched away to reveal the gate oxide 160 covering the source regions, thus leaving behind completed gates 170 surrounding the intrinsic silicon channel regions.

At 118, epitaxial nanowires 151p,n are encapsulated. In one embodiment, encapsulation is accomplished by spin coating a third BCB layer 172, followed by a CMP process that is targeted to stop when a selected BCB thickness has been reached, above the gate structures 159.

At 120, the third BCB layer 172 and the gate oxide 160 are etched back to a height 173 above a top surface of the gate metal 164, to reveal the top 3 nm-300 nm of the InAs and BSi$_x$Ge$_{(1-x)}$ source regions 154$n,p$, as shown in FIGS. 9-12.

At 122, source regions 154$n$, $p$ are encapsulated. In one embodiment, encapsulation is accomplished by spin coating a fourth BCB layer 174, followed by a CMP process that is targeted to stop when a selected BCB thickness has been reached, above the gate structures 159. Alternatively, an oxide deposited using a high density plasma (HDP) process can be used in place of the fourth BCB layer 174.

Figure 10:
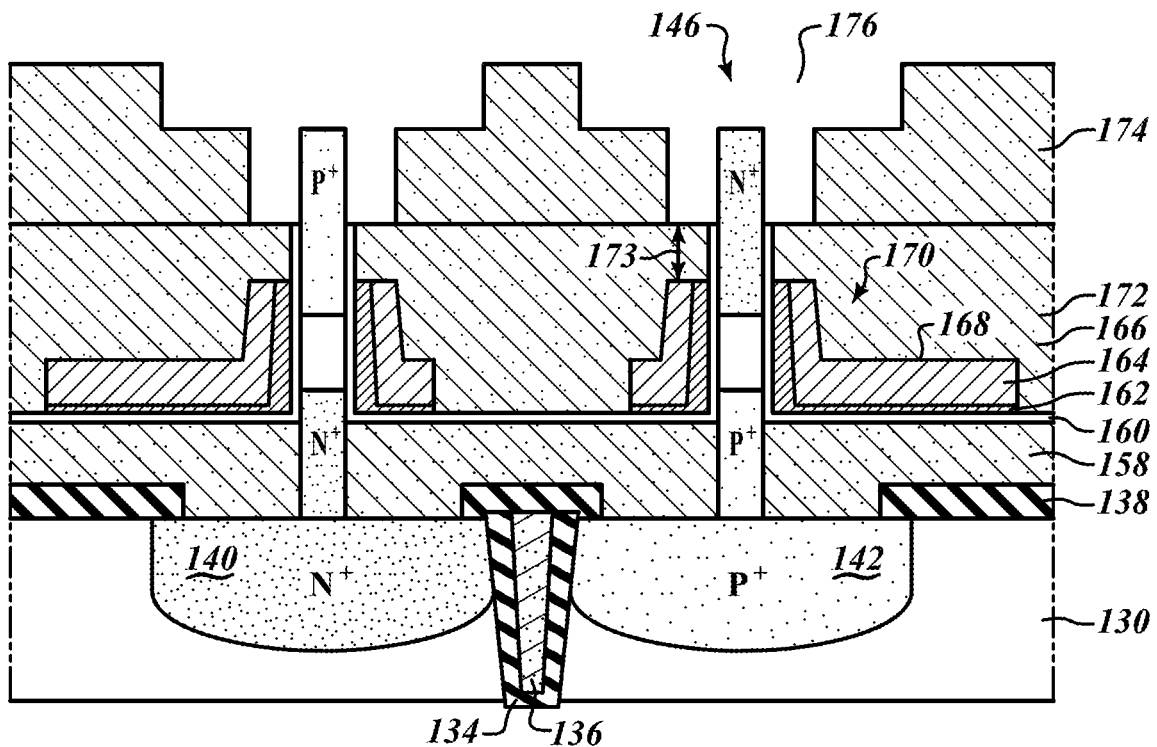
Figure 11:
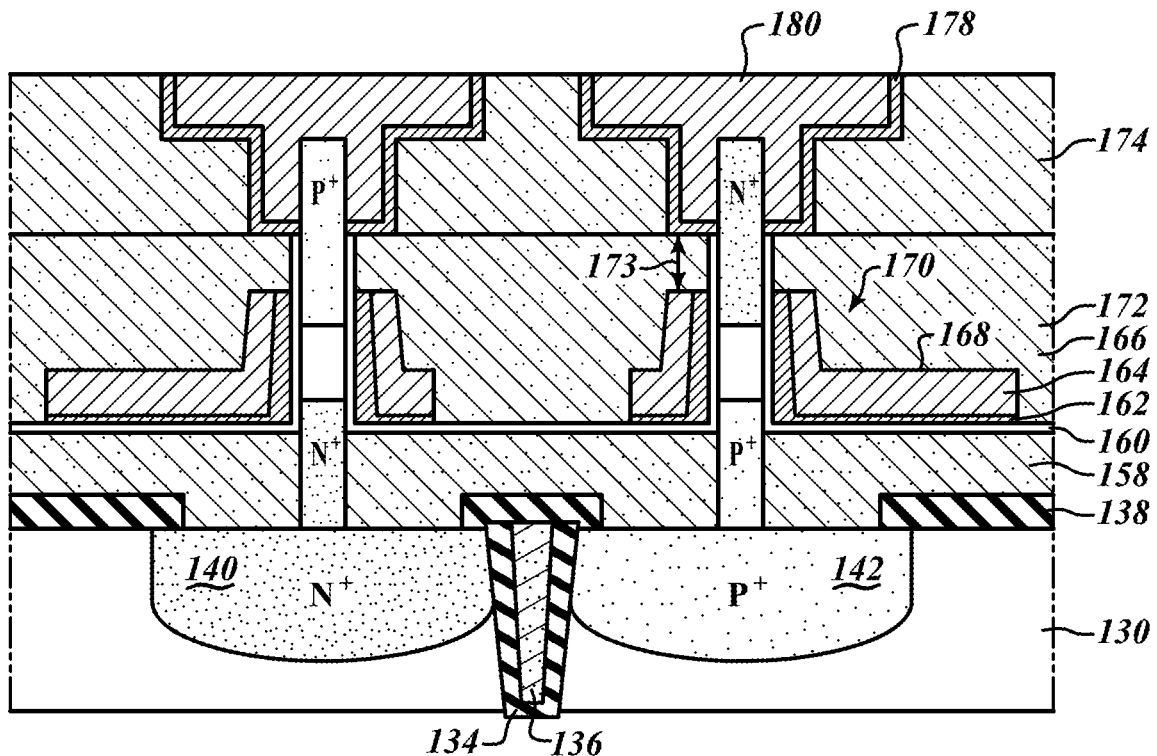

At 124, contacts are made to the source regions. In one embodiment, a dual damascene process is used to form front side source contacts 182 to the epitaxial nanowire and a metal interconnect layer, while backside contacts 184 are made to the epitaxial drain regions 150$n,p$ via the implant-doped well regions. First, dual damascene trenches 176 are etched in the fourth BCB layer 174, as well as contact holes surrounding the source regions 154$n,p$, as shown in FIG. 10. Then the source regions 154$n,p$ can be reacted with metal to form a silicide e.g., TiSi, NiSiPt, or a dual silicide such as Pt, Ir for the p-type source 154$p$, or Er, Yb for the n-type source 154$n$ prior to filling the trenches and contact holes using established methods familiar to those skilled in the art of damascene processing. The metal fill desirably includes a liner made of, for example, TiN or TiC. The metal is then planarized to stop on the fourth BCB layer, as shown in FIG. 11. Finally, metal contacts of thickness 5 nm-50 μm are made to the backside of the wafer to contact the N-well 140 and the P-well 142, as shown in FIG. 12.

Figure 13:
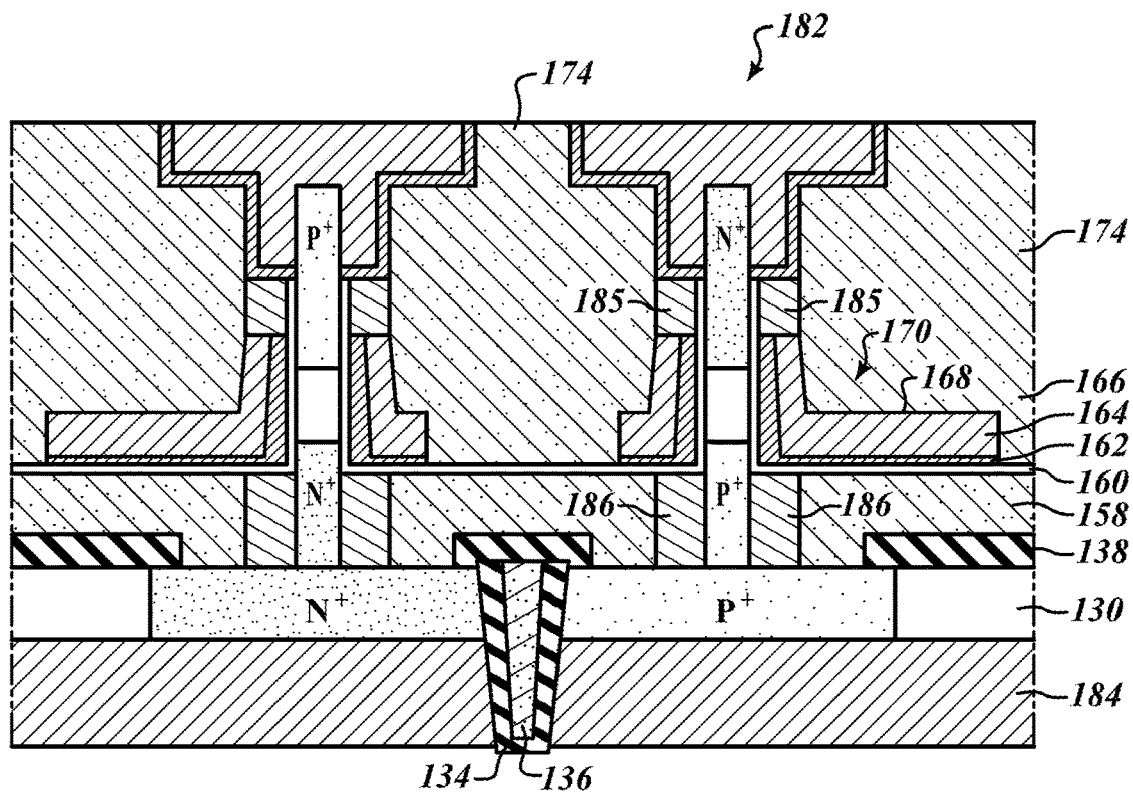
FIGS. 13-14 are cross-sectional views of alternative embodiments of completed n-type and p-type vertical GAA TFETs shown in FIG. 12, wherein each embodiment has a different contact configuration, as described herein.

FIG. 13 shows a second embodiment of the vertical GAA TFET in which additional spacers are wrapped around the pillars between the gate structures 170 and the source and drain regions. A first spacer 185 is formed between the gate structures 170 and the source regions 154$n,p$, and a second spacer 186 is formed between the gate structures 170 and the drain regions 140, 142. The spacers 185, 186 can be made of SiN or SiC, for example.

Figure 14:
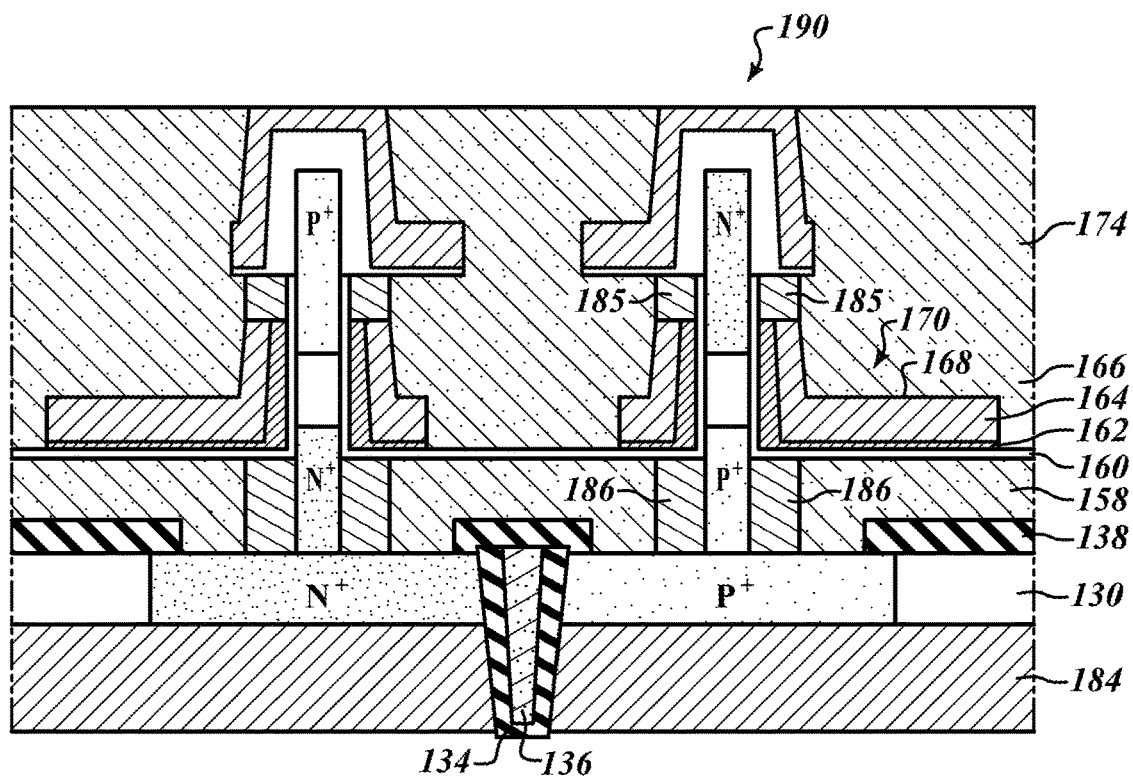

FIG. 14 shows a third embodiment of the vertical GAA TFET that features etched source contacts 190 in place of dual damascene contacts 182. The source contacts 190 differ from the dual damascene contacts 182 in that the source contacts 190 are formed by a subtractive etching process as opposed to forming and filling a trench, which is an additive process. Although either method can be used to form contacts to the source terminals of the GAA TFET, the front side source contacts 182 formed by the dual damascene process may offer lower contact resistance and a more flexible wire connection.

Figure 15:
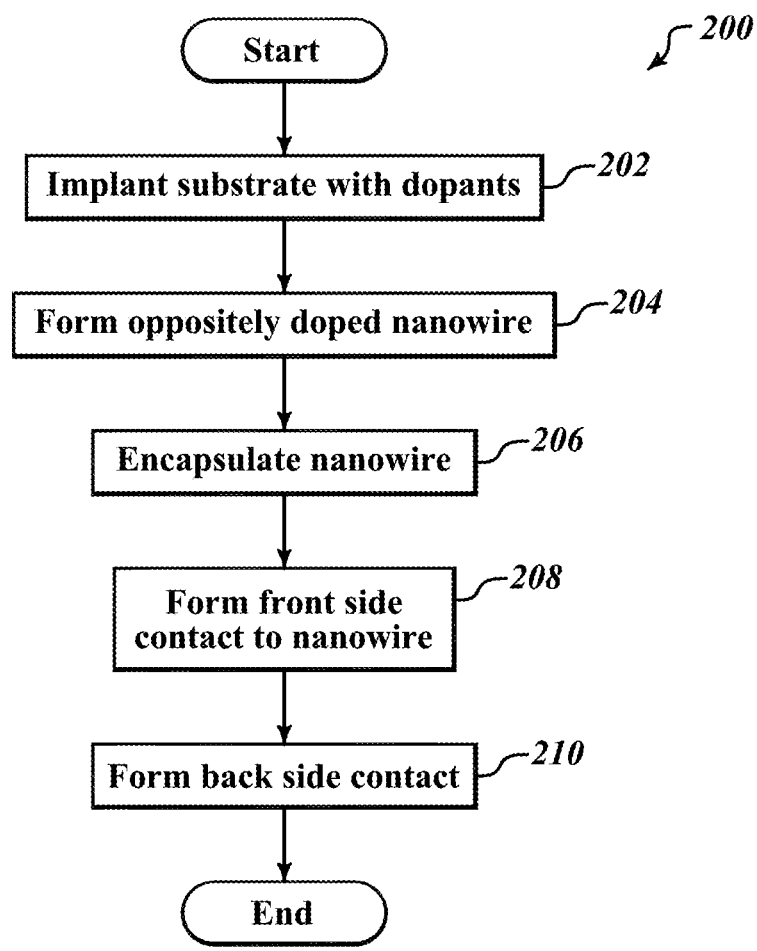
FIG. 15 is a flow diagram showing steps in a method of fabricating a pair of vertical diodes as illustrated in FIGS. 16-18, according to a first embodiment as described herein.

FIG. 15 shows steps in a method 200 of fabricating a vertical diode, according to one embodiment. The vertical diode can provide electrostatic discharge (ESD) protection for the vertical GAA TFET described above, to improve reliability. One advantage of the vertical diode is its small footprint, which is particularly useful in supporting GAA transistors used to form digital SRAM and DRAM arrays. The method 200 is further illustrated by FIGS. 16-19, and described below. The ESD diode fabrication process can be performed at the same time as formation of the vertical GAA TFET and therefore the same reference numerals are used in the following description of the ESD diode formation, wherever possible.

At 202, the silicon substrate 130 is implanted with dopants through openings in an implant hard mask 138 on a top side or surface 129 of the substrate 130. In one embodiment, the implant hard mask 138 is a 10 nm-50 nm thick layer of SiO$_2$. An opening in the implant hard mask 138, in the range of about 2 nm-200 nm can be patterned using an RIE process. Positive ions, such as boron, can then be implanted in the substrate to form a p-doped region, or P-well 142, shown in FIG. 16, having a dopant concentration of 1.0 E16 cm$^{-3}$-1.0 E 20 cm$^{-3}$. The P-well 142 is formed between a first portion 130-1 of the substrate 130 and a second portion 130-2 of the substrate 130.

Figure 16:
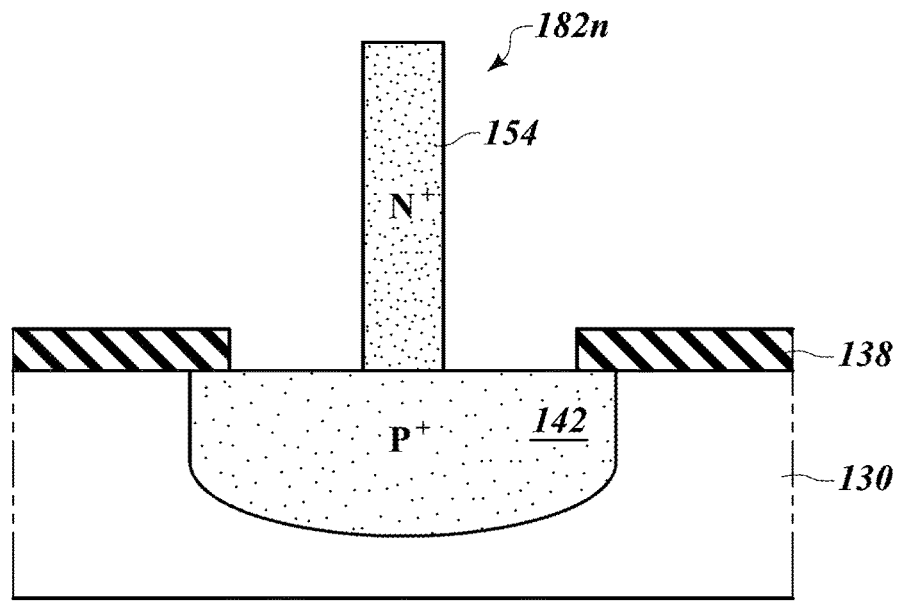
FIGS. 16-18 are cross-sectional views of the pair of vertical diodes at successive steps during fabrication using the method shown in FIG. 15.
Figure 17:
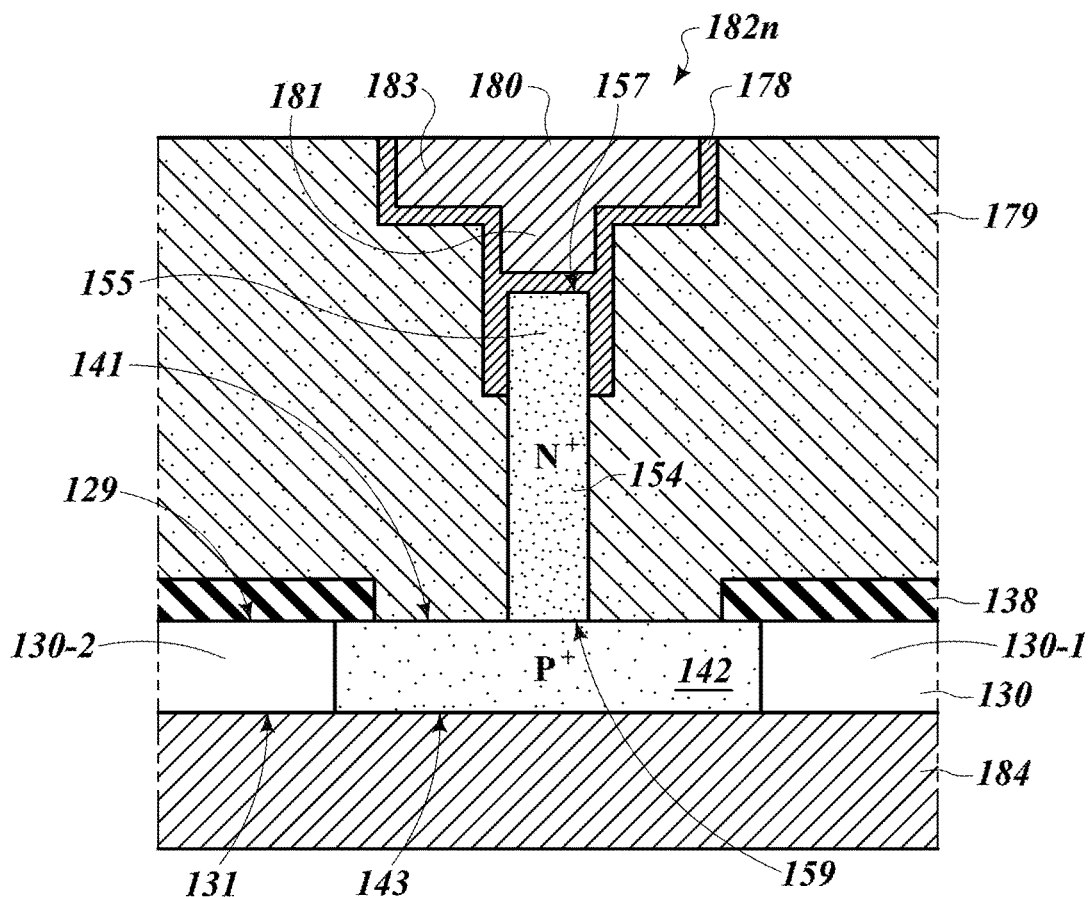

At 204, an n-doped vertical nanowire 154 having a top end 157 and a bottom end 159, shown in FIG. 16, is formed by epitaxial growth from a top side or surface 141 of the p-doped region 142. In one embodiment, the vertical nanowire 154 is made of indium arsenide (InAs) having a diameter anywhere in the range of about 2 nm-200 nm and a height anywhere in the range of about 8 nm-800 nm. Growth of the vertical nanowire 154 can be performed in a metal organic chemical vapor deposition (MOCVD) chamber using a trimethyl-indium (TMIn) source and a tertiarybutyl-arsine molar flow of 0.7 μMol/min-12.6 μMol/min, at a reactor pressure of 60 Torr, and a temperature between 400 C and 600 C. Negative doping of the vertical nanowire 154 can be achieved in-situ by injecting disilane gas (Si$_2$H$_6$) during the epitaxial growth process at Si$_2$H$_6$/TMIn ratios of $10^{-6}$-$10^{-2}$. The junction of the bottom end 159 of the n-doped vertical nanowire 154 and the top side or surface 141 of the p-doped region 142 form a p-n diode 182$n$.

At 206, the vertical nanowire 154 is encapsulated. In one embodiment, an encapsulant 174 is a layer of benzocyclobutene (BCB) that is spin-coated to cover the p-n diode 182$n$, and a CMP process is then used to planarize the encapsulant 174 to a target thickness above the vertical nanowire 154.

At 208, a front side contact is formed to the vertical nanowire 154 using a dual damascene process similar to that shown in FIGS. 10-11 and described above, in which a contact via and a metal line trench having a T-shaped profile are etched in the encapsulant 174, and then the contact via and the metal line trench are filled with metal. The metal fill includes a liner 178 such as TiN, Ti/TiN, Ta, or TaN that surrounds a top portion 155 of the vertical nanowire 154, and a bulk metal 180 such as W, Al, Cu, or Au that has a bottom portion or region 181 and a top portion or region 183. A silicidation process may be performed is formed at the contact surfaces of the vertical nanowire 154 to further reduce contact resistance as described above. The bulk metal is then planarized to stop on the BCB layer.

At 210, a backside contact 184 is made on a bottom side or surface 131 of the substrate 130 to a bottom side or surface 143 of the P-well 142, similar to those shown in FIGS. 12-14 and described above.

Figure 18:
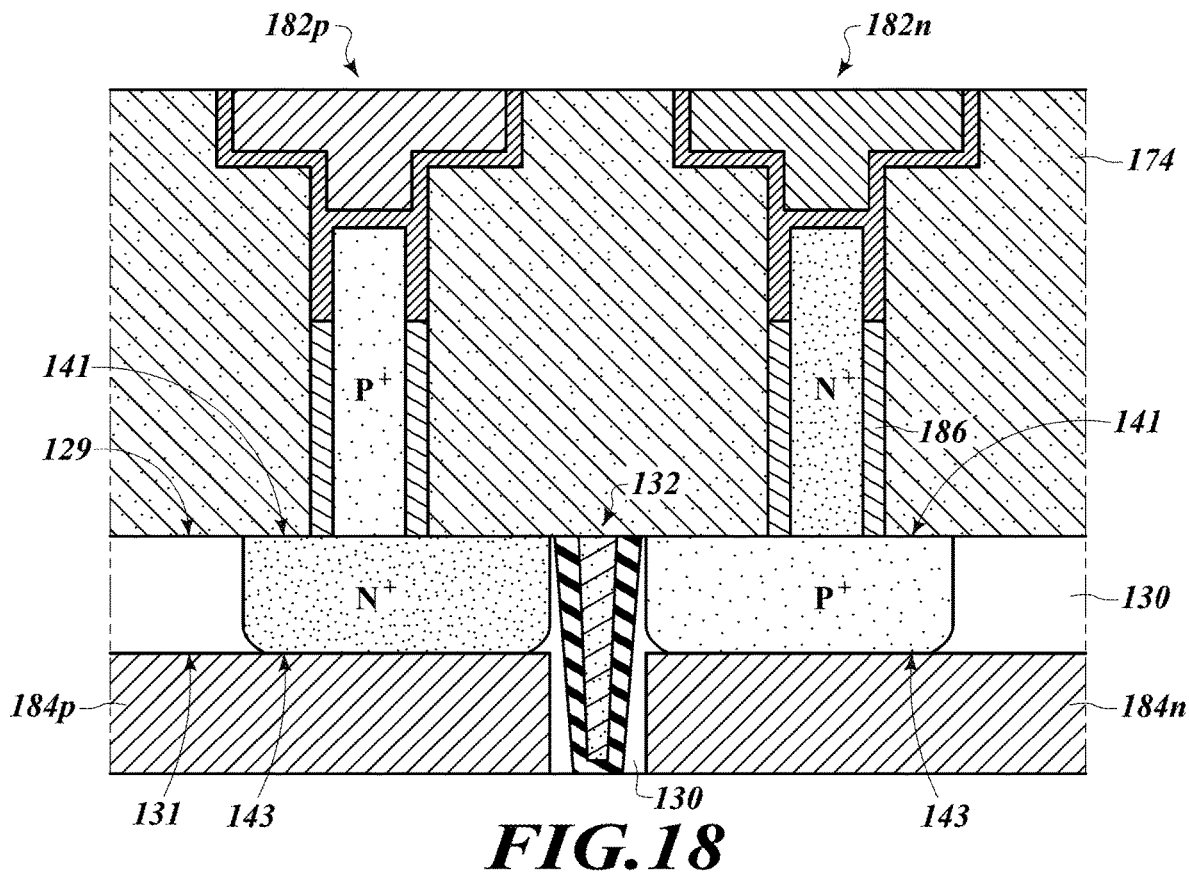

FIG. 18 shows a pair of vertical diodes, including the p-n diode 182$n$ described above, and a reciprocal p-n diode 182$p$. Whereas the p-n diode 182$n$ includes a P-well and an n-doped vertical nanowire, the p-n diode 182$p$ includes an N-well and a p-doped vertical nanowire. The two diodes are separated by an isolation region 132 that can be formed in the usual way, prior to doping the silicon substrate 130. The diodes 182$p$ and 182$n$ have separate backside contacts 184$p$ and 184$n$. Optional spacers 186 may be formed below the contact vias, prior to the encapsulation step 206. The spacers 186 can be made of SiC or SiCNH, for example.

Figure 19:
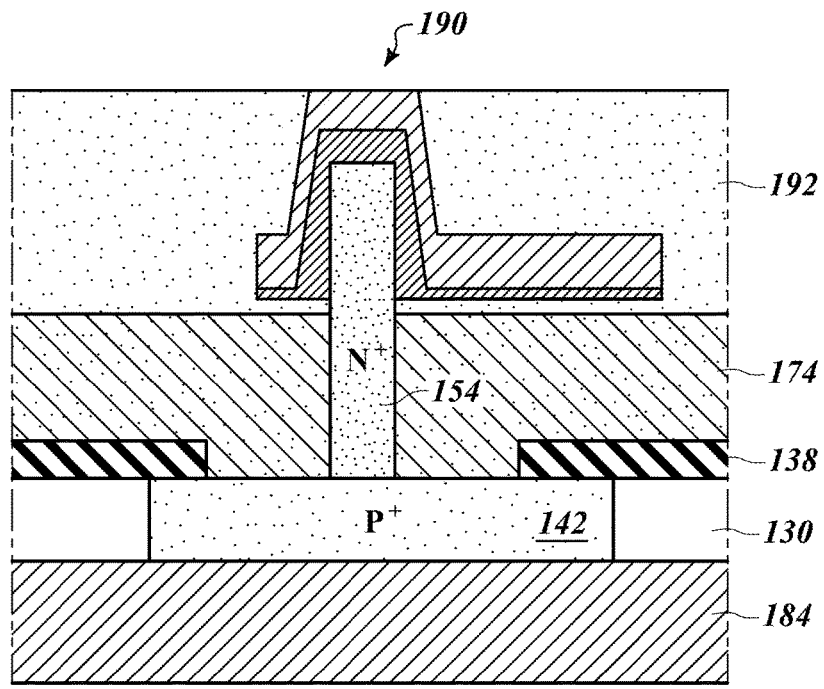
FIG. 19 is a cross-sectional view of a completed vertical diode, according to a second embodiment as described herein.

FIG. 19 shows an alternative contact 190 to the vertical p-n diode 182$n$. The alternative contact 190 is formed by recessing the encapsulant 174 down to a level below the top of the vertical nanowire 154, and then performing metallization using a subtractive process instead of a dual damascene process. The subtractive process entails conformally depositing a layer of metal and patterning and etching the metal, producing an inverted V-shaped profile. The alternative contact 190 is better suited to metal materials such as AlCu as opposed to Cu, which is difficult to etch. Following formation of the alternative contact 190, a top ILD layer 192 is deposited and planarized to stop on the inverted V-shaped contact 190.

Figure 20:
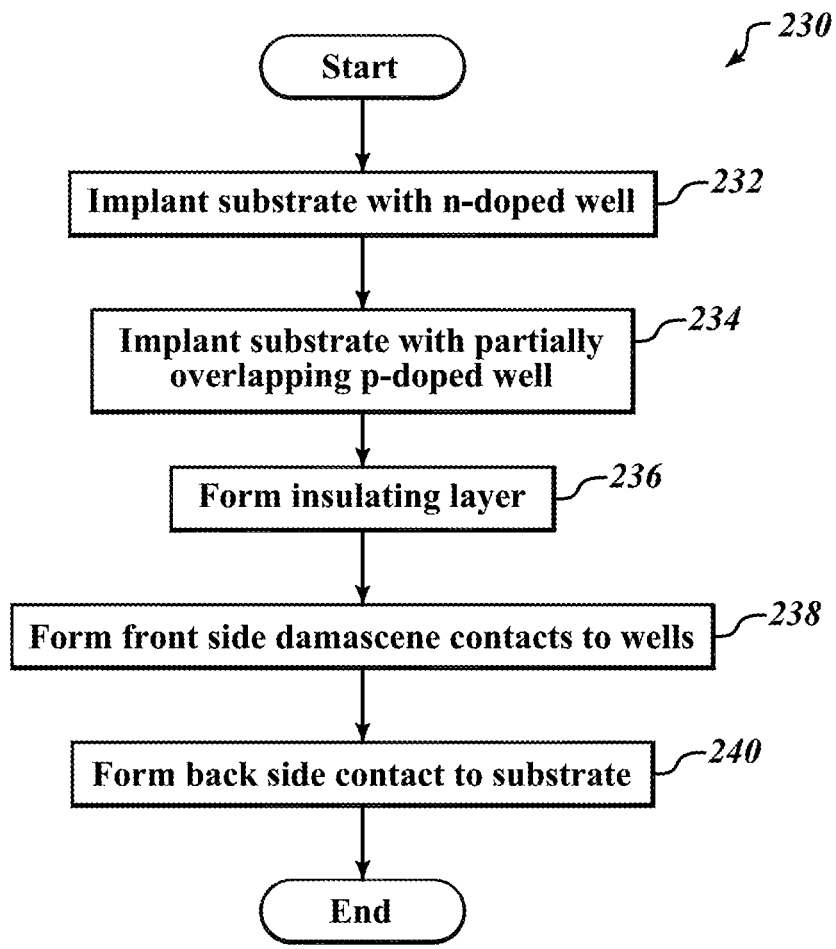
FIG. 20 is a flow diagram showing steps in an alternative method of fabricating vertical diodes and a horizontal diode, according to one embodiment described herein.
Figure 21:
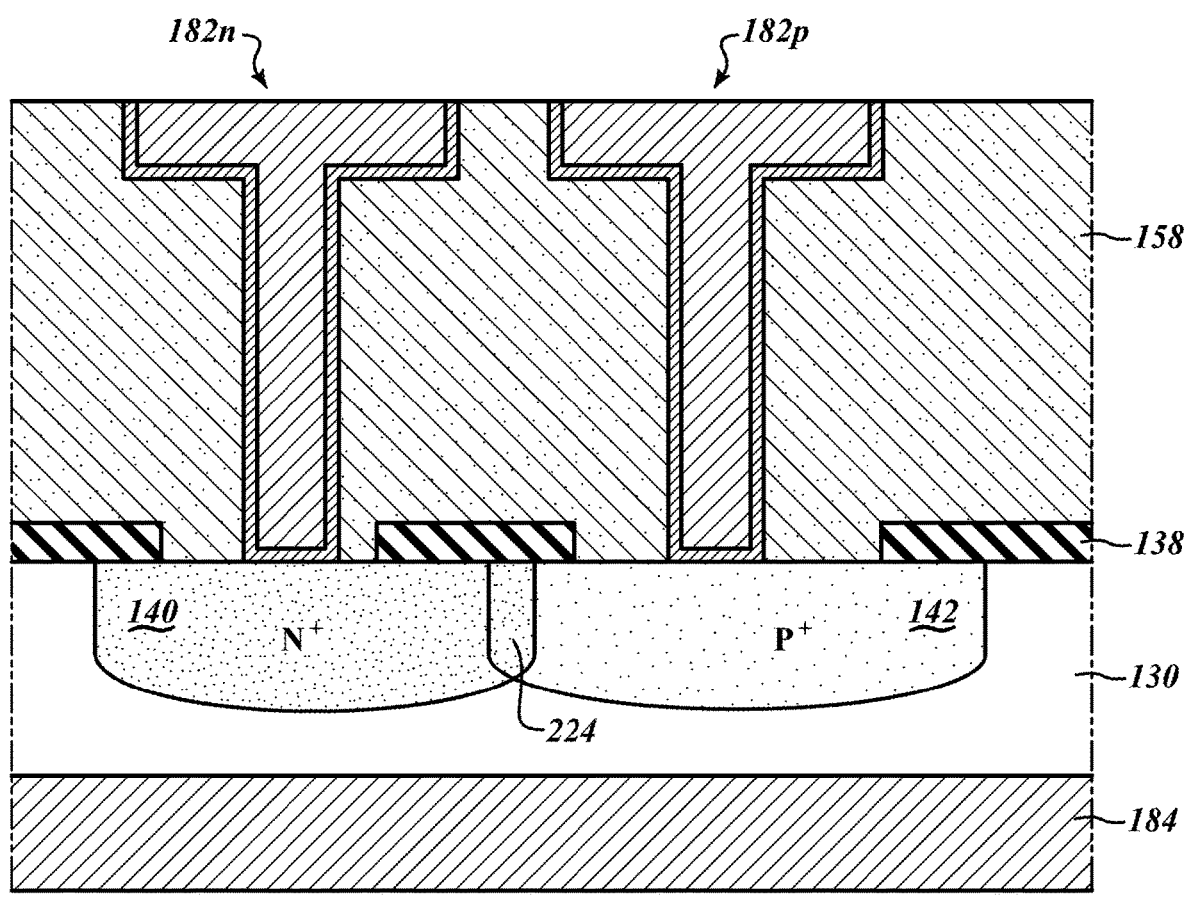
FIG. 21 is a cross-sectional view of a completed pair of vertical diodes and a horizontal diode fabricated using the method shown in FIG. 20.

FIG. 20 shows steps in a method 230 of fabricating an integrated horizontal p-n junction diode 222, according to one embodiment shown in FIG. 21.

At 232, the silicon substrate 130 is implanted with an N-well 140 as described above in step 104.

At 234, the silicon substrate 130 is implanted with a P-well 142 adjacent to the N-well 140 as described above in step 104, except that the P-well 142 partially overlaps the N-well 140 at 224. The overlap can be accomplished via mask alignment or by using a tilted implantation process. The horizontal p-n junction diode 222 thus formed is useful in protecting GAA transistors used in analog and I/O circuits that sustain high currents and voltages.

At 236, an insulating layer is formed, for example, the BCB encapsulant 158, using a process similar to the one described above in step 110.

At 238, front side damascene contacts are made to the N-well 140 and the P-well 142, using a process similar to the one described above in step 124, wherein the contacts have T-shaped profiles.

At 240, the backside contact 184 is formed to the silicon substrate 130.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A device, comprising:
   a substrate that includes a first side and a second side facing away from the first side;
   a doped well extends into the first side of the substrate;
   a drain region on the first side of the substrate, the drain region is coupled to the doped well;
   an intrinsic silicon layer;
   a source region on the first side of the substrate, the source region aligned with the drain region and separated from the drain region by the intrinsic silicon layer, the intrinsic silicon layer being between the source region and the drain region;
   a gate region on the first side of the substrate, the gate region surrounding the intrinsic silicon layer between the source region and the drain region;
   a first spacer adjacent to the drain region, the first spacer separates the gate region from the doped well;
   a contact on the first side of the substrate, the contact aligned with the doped well, the drain region, and the source region; and
   a second spacer adjacent to the source region, the second spacer separates the gate region and the contact.

2. The device of claim 1, wherein the first spacer surrounds the drain region and has a first height less than a second height of the drain region.

3. The device of claim 2, wherein the second spacer surrounds the source region and has a third height less than a fourth height of the source region, the third height of the second spacer is less than the first height of the first spacer.

4. The device of claim 1, wherein the first spacer is in direct contact with the drain region.

5. The device of claim 1, further comprising:
   a dielectric layer separates the gate region and the second spacer from the intrinsic silicon layer between the source region and the drain region, the dielectric layer surrounds the intrinsic silicon layer between the source region and the drain region, the dielectric layer is exposed to the intrinsic silicon layer, and the dielectric layer separates the gate region from the drain region and the source region.

6. The device of claim 5, wherein the gate region includes:
   a first conductive layer on the dielectric layer; and
   a second conductive layer on the first conductive layer, the first conductive layer is between the second conductive layer and the dielectric layer.

7. The device of claim 5, further comprising:
   a first insulating layer, the first insulating layer surrounds the first spacer;
   a second insulating layer, the second insulating layer surrounds the gate region, the second spacer, the source region and the contact.

8. The device of claim 1, wherein the first spacer and the second spacer are a silicon material.

9. The device of claim 1, further comprising a second contact on the second side of the substrate, the second contact is coupled to the doped well.

10. A device, comprising:
    a substrate having a first side and a second side facing away from the first side;
    a doped region in the substrate;
    a drain structure on the first side of the substrate;
    a intrinsic silicon layer;
    a source structure on the first side of the substrate, the source structure aligned with the drain structure and separated from the drain structure by the intrinsic silicon layer, the intrinsic silicon layer being between the source structure and the drain structure;
    a gate structure surrounds the intrinsic silicon layer between the source structure and the drain structure;
    a dielectric layer surrounds the intrinsic silicon layer between the source structure and the drain structure, the dielectric layer separates the gate structure from the intrinsic silicon layer, the dielectric layer is exposed to the intrinsic silicon layer; and
    a first contact on the first side of the substrate and aligned with the drain structure, the source structure, the gate structure, and the intrinsic silicon layer.

11. The device of claim 10, wherein the gate structure includes:

a first conductive layer; and a second conductive layer, the second conductive layer is positioned between the first conductive layer and the dielectric layer.

12. The device of claim 10, wherein the source structure extends into the first contact on the first side of the substrate.

13. The device of claim 10, wherein the first contact further comprises:

a first portion with a first width;

a second portion with a second width greater than the first width of the first portion.

14. The device of claim 10, further comprising:

a liner layer on a surface of the first contact, the liner layer separates the first contact and the dielectric layer.

15. The device of claim 10, further comprising a second contact on the second side of the substrate, and the second contact coupled to the doped well in the substrate.

16. A device, comprising:

a substrate including a first side and a second side that faces away from the first side;

a doped well in the substrate;

a hard mask layer on the first side of the substrate that extends onto a portion of the doped well;

an insulating layer on the first side of the substrate, the first insulating layer is on the doped well and is on the hard mask layer;

a dielectric layer on the insulating layer;

a source structure on the first side of the substrate, the source structure is coupled to the doped well and extends through the insulating layer and the dielectric layer; and a v-shaped contact is coupled to the source region.

17. The device of claim 16, wherein the v-shaped contact includes a liner layer and a conductive layer, the liner layer is positioned between the source region and the conductive layer.

18. The device of claim 16, wherein the liner layer of the v-shaped contact is separated from the insulating layer by the dielectric layer.

19. The device of claim 16, wherein a contact is on the second side of the substrate and the contact is coupled to the doped well in the substrate.

20. The device of claim 16, wherein the dielectric layer surrounds the v-shaped contact and covers the insulating layer.

* * * * *